United States Patent [19]

Nakashima et al.

[11] 4,214,311
[45] Jul. 22, 1980

[54] METHOD AND APPARATUS FOR MEASURING INSULATION RESISTANCE

[75] Inventors: Koichi Nakashima; Kiyosi Nagaoka; Toshihisa Hikosaka, all of Wakayama, Japan

[73] Assignee: Sumitomo Metal Industries, Ltd., Osaka, Japan

[21] Appl. No.: 855,344

[22] Filed: Nov. 28, 1977

[30] Foreign Application Priority Data

Dec. 2, 1976 [JP] Japan .................... 51-144905

[51] Int. Cl.$^2$ ............................................. G01R 27/00
[52] U.S. Cl. ..................................... 364/482; 324/54; 324/62; 340/649
[58] Field of Search ............ 364/481, 482; 324/57 R, 324/62, 64, 154 R, 51, 54; 340/248 R, 248 F, 248 N, 255, 649–651; 361/42

[56] References Cited

U.S. PATENT DOCUMENTS

| | | | |
|---|---|---|---|
| 3,066,284 | 11/1962 | McKinley et al. | 340/651 |
| 3,652,930 | 3/1972 | Sugiyama et al. | 364/482 |
| 3,927,368 | 12/1975 | Zielonko et al. | 324/62 |
| 3,947,759 | 3/1976 | Briggs | 324/51 |
| 3,961,224 | 6/1976 | Vreeland | 361/42 |
| 3,969,711 | 7/1976 | Ahntholz | 361/42 |
| 4,066,950 | 1/1978 | Rumold et al. | 324/62 |

*Primary Examiner*—Errol A. Krass
*Attorney, Agent, or Firm*—Wenderoth, Lind & Ponack

[57] ABSTRACT

A method for continuously measuring and monitoring insulation resistance values of a non-grounded DC circuit in an operative condition and an apparatus for practicing the method are disclosed. This method is to calculate various values including the values of the insulation resistances across three lines forming the non-grounded DC circuit by continuously measuring only two voltages across the three lines forming that circuit. The apparatus includes voltage detecting means, switching means, memory means, and calculating means. A load resistance is connected to each of the positive power line and the negative power line, and the switching means operates to selectively ground these load resistances. The voltage detecting means further includes a buffer circuit. The memory means temporarily stores the detected voltage value. The calculating means is connected to the memory means for calculating various values including the insulation resistance values utilizing the voltage values.

6 Claims, 10 Drawing Figures

WHERE: $V_{OA}$ : AVERAGE OPERATION VOLTAGE VALUE
$V_{PA}$ : AVERAGE VOLTAGE VALUE OF POSITIVE
$V_{NA}$ : AVERAGE VOLTAGE VALUE OF NEGATIVE

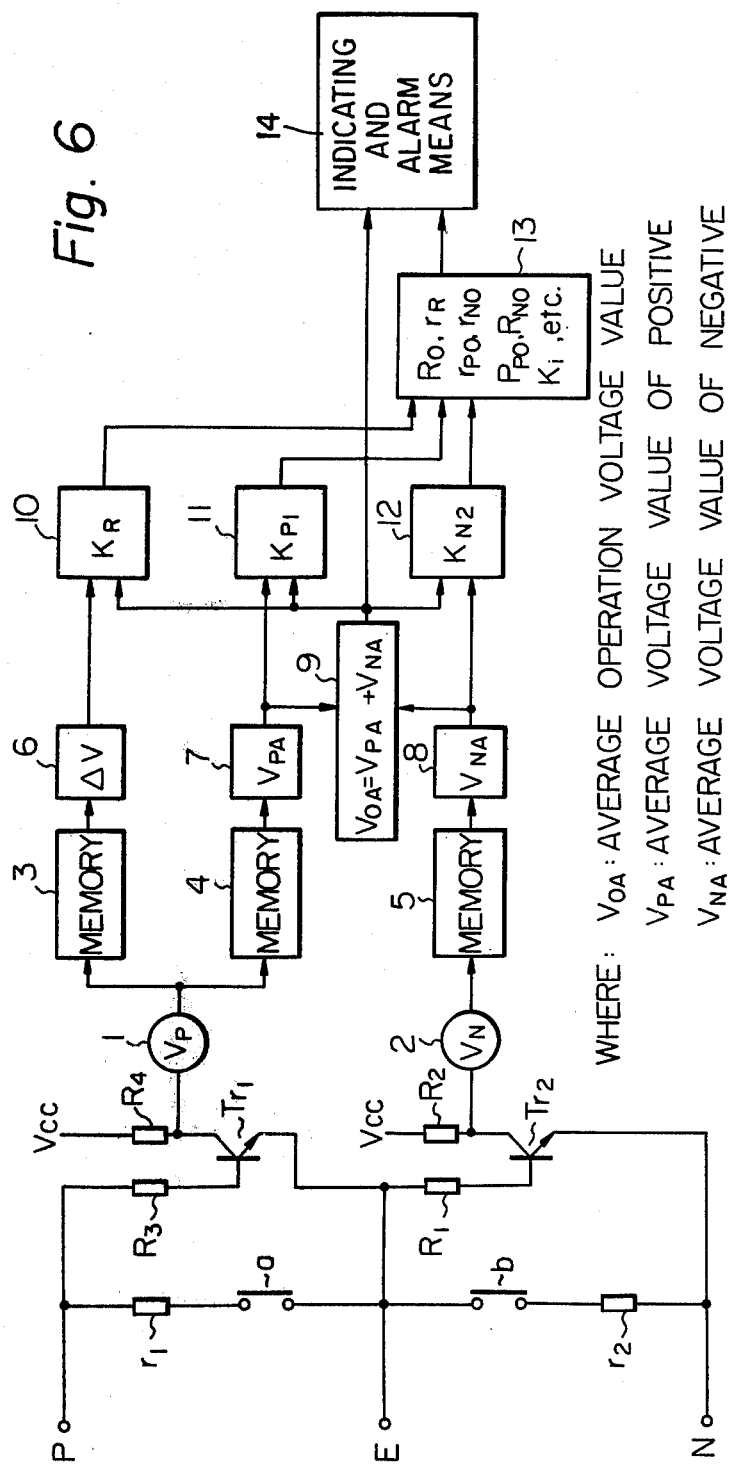

METHOD AND APPARATUS FOR MEASURING INSULATION RESISTANCE

BACKGROUND OF THE INVENTION

The present invention relates to a method and an apparatus for measuring insulation resistances and, particularly, to a method and an apparatus for continuously measuring insulation resistances of a non-grounded DC circuit including a rectified electric power source and of load means connected to that DC circuit.

Insulation control of low-voltage electric machines such as, for example, large DC rotary machines and the like is essential for securing safety and maintaining safe operation in, for example, manufacturing plants in which such machines are used. For this purpose, it is desirable that information on the insulating condition of each such machine is collected continuously and automatically.

Heretofore, since measurement of the insulating condition of such machines for insulation control was performed by maintenance workers who checked each machine with a megaohmmeter each time it was necessary after the operation of the machine was finished, opportunities for such measurement were limited, each measurement required many steps, security of the maintenance workers was insufficient, and continuous measurement during operation of the machines was impossible at all.

We previously proposed apparatuses capable of measuring the insulation resistances of a non-grounded DC circuit and the load means connected thereto during the operation thereof which was heretofore impossible by megaohmmeter. Namely, Japanese Pat. No. 76073/77 discloses means for measuring three voltages across the positive line and the negative line and across each of them and the ground of a non-grounded DC circuit in an operative condition and for calculating the three insulation resistance values across said positive and negative lines and across each of these two lines and the ground directly from the measured voltage values, means for calculating the variation rate of the voltage across the positive and negative lines from the measured voltages and for thereafter calculating the insulation resistance value across said positive and negative lines from this variation rate and the measured voltage values, and means for calculating the ratio of the insulation resistance value calculated for each measurement to the value, the preceding measurement. Japanese Pat. No. 91475/77 discloses means, as in Japanese Pat. No. 76073/77, for measuring three voltages successively and calculating a voltage ratio for each measured voltage and further calculating the insulation resistance value across the positive line and the negative line from these voltage ratios, and means for calculating the ratio of the voltage ratio of each measurement to the voltage ratio of the preceding measurement. Japanese Pat. No. 91476/77 discloses means for measuring three instantaneous voltage values across the positive line and the negative line and across each of these and the ground of a non-grounded DC circuit in an operative condition, calculating the average variation value and the average value of the measured instantaneous voltage values, and calculating the insulation resistance values across the positive and negative lines, across a rotary machine between these two lines and the ground, and across each of these two lines and the ground directly from the average variation value and the average value and the measured instantaneous voltage values, means for calculating respective voltage ratios from the average variation value, the average value and the three instantaneous voltage values and calculating thereafter insulation resistance values as above from these voltage ratios, and means for calculating the ratio of the voltage ratio calculated for each measurement to the voltage ratio of the preceding measurement. These insulation resistance measuring apparatuses according to prior art are relatively complicated in the principle for calculation of the insulation resistances and require many voltages to be measured. Accordingly, these prior apparatuses are inevitably of a complicated construction requiring complicated operation which tends to result in an undesirable decline in reliability, increase in cost and complexity of maintenance.

Accordingly, a principal object of the present invention is to provide a relatively simple method for obtaining various required insulation resistance values by continuous measurement of only two voltages.

Another object of the present invention is to provide a method having a reference for evaluating various calculated insulation resistance values and capable of monitoring variation of each insulation resistance value and of giving an alarm, when necessary.

A further object of the present invention is to provide an apparatus for practicing said objects.

SUMMARY OF THE INVENTION

The method for measuring insulation resistance according to the present invention calculates the required insulation resistance values and other values by continuously measuring only two voltages across three lines forming a non-grounded DC circuit, namely the positive line, the negative line and the ground line, under operative condition. This is accomplished by forcing changes in the proportions of the voltages across the three lines by selectively and successively grounding the positive and negative lines through respective measurement resistances and at the same time successively measuring the two voltages before and after the forced changes and by calculating the desired values as will be described hereinunder in detail.

The method according to the present invention evaluates the accuracy of the calculated insulation resistance values and the variation of the insulation resistance values is monitored and an alarm is given when an undue variation exceeding a predetermined value is detected.

The apparatus for practising the method according to the present invention includes a measuring circuit for selecting and measuring only two instantaneous voltage values across three lines forming a non-grounded DC circuit, namely the positive line, the negative line and the ground line, under operative conditions, switching means for selectively grounding through respective measurement resistances the positive and negative lines, memory means for temporarily storing the measured instantaneous voltage values, calculating means for obtaining the average variation value, the average value of the instantaneous voltages to ground and the average voltage across the positive and negative lines, calculating means for obtaining voltage dividing ratios of the average voltage across the positive and negative lines to the average variation value and to the average value respectively of the voltages to ground, and calculating means for obtaining from these voltage dividing ratios a total insulation value between the positive and negative lines, the insulation resistance value of the load device connected to each of the positive and negative lines, and the insulation resistance value to ground of each of the positive and negative lines.

The apparatus for practicing the method according to the present invention includes a calculating means constructed so as to evaluate the accuracy of the various calculated values of the insulation resistances and to compare the variation of the insulation resistance values with a predetermined reference value and to detect any extraordinary variation, and further includes means for indicating the result and giving an alarm when necessary.

BRIEF DESCRIPTION OF THE DRAWINGS

The invention will be better understood from the following description taken in connection with the accompanying drawings in which:

FIG. 6 is a schematic circuit diagram illustrative of an embodiment of the apparatus for practicing the method according to the present invention.

DETAILED DESCRIPTION OF THE PREFERRED EMBODIMENT

The present invention is applicable to continuous and automatic measurement and monitoring of the insulation resistances of a non-grounded DC circuit and the load means connected to said circuit.

A practical application of the present invention will now be described with reference to an embodiment of the arrangement in which a DC rotor is connected to a non-grounded low voltage DC circuit.

First, the measuring principle of the apparatus according to the present invention will be described with reference to the drawings.

Figure 1A:
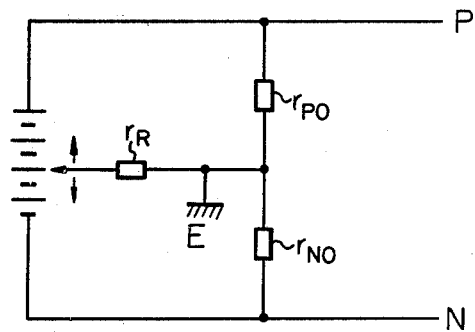
FIGS. 1A and 1B are basic equivalent circuit diagrams of non-grounded DC circuits to be measured.
Figure 1B:
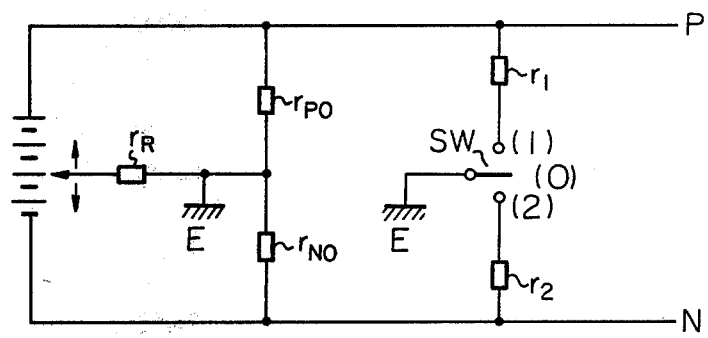

If the value of the insulation resistance of the DC rotor when the insulation thereof is deteriorated is denoted $r_R$, the basic equivalent circuit of the apparatus is shown by FIG. 1A in which $r_{PO}$ and $r_{NO}$ denote insulation resistance values between the ground E and the positive and the negative lines P and N, respectively, to which the rotor is connected. FIG. 1B shows a circuit obtained by adding resistances $r_1$ and $r_2$ selected by electrical switching means SW to the basic circuit of FIG. 1A. In the circuit of FIG. 1B, the voltages to be measured are $V_P$ (instantaneous operating voltage value across P-E), and $V_N$ (instantaneous operating voltage value across N-E), and $V_O$ (instantaneous operating voltage value across P-N).

In this circuit, the values to be determined are $r_R$, $r_{PO}$, $r_{NO}$ and the total insulation resistance value of this circuit $R_O$ which can, however, be obtained from other values to be described hereinafter and, accordingly, the unknown values to be determined immediately are the first three, namely $r_R$, $r_{PO}$ and $r_{NO}$. In order to determine these three unknown values, two independent conditional formulas and a relational formula relating to average variable voltage $\Delta V$ are required. Of these three formulas, the one relating to the average variable voltage $\Delta V$ is:

$$\Delta V = 1/\pi \cdot (V_{Pmax} - V_{Pmin}) = 1/\pi \cdot (V_{Nmax} - V_{Nmin}) \quad (1)$$

Where:
$V_{Pmax}$ is the maximum value of $V_P$.
$V_{Pmin}$ is the minimum value of $V_P$.
$V_{nmax}$ is the maximum value of $V_N$.
$V_{Nmin}$ is the minimum value of $V_N$.

In this case, $V_O$ is a DC voltage and $V_P$ and $V_N$ are in sinusoidal waves. Then, the other two independent conditional formulas are obtained from combinations of said $r_1$, $r_2$ and $V_P$, $V_N$, $V_O$, and, as shown in Table 1, nine different combinations are possible from the positions (0), (1) and (2) of the switch of FIG. 1B and the measured voltages $V_P$, $V_N$ and $V_O$.

Table 1

| No. | Combination of Voltage Indication | Switch Position of FIG. 1B |
|---|---|---|
| 1 | $V_P$ and $V_N$ | (1) and (2) |
| 2 | | (0) and (1) |
| 3 | | (0) and (2) |
| 4 | $V_O$ and $V_P$ | (1) and (2) |
| 5 | | (0) and (1) |
| 6 | | (0) and (2) |
| 7 | $V_O$ and $V_N$ | (1) and (2) |
| 8 | | (0) and (1) |
| 9 | | (0) and (2) |

While the combination No. 1, which is supposed to be the most preferable one, will be described hereinunder, it will be obvious that other combinations may be described similarly and that the formulas become different from each other only by difference in combinations of the constants and the variables thereof.

Figure 2:
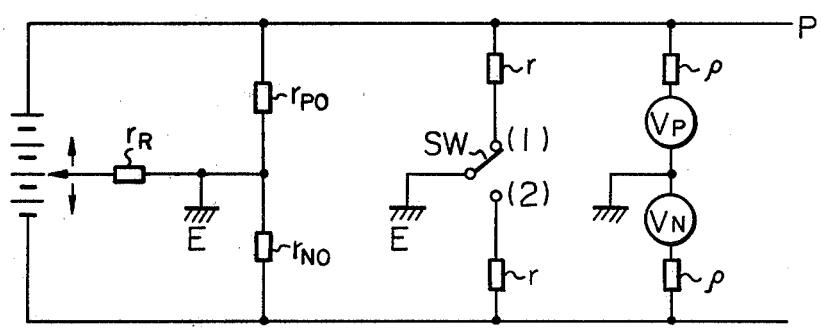
FIG. 2 is an equivalent circuit diagram of a circuit to be measured in a preferred combination of a measuring voltage and a switch.
Figure 3A:
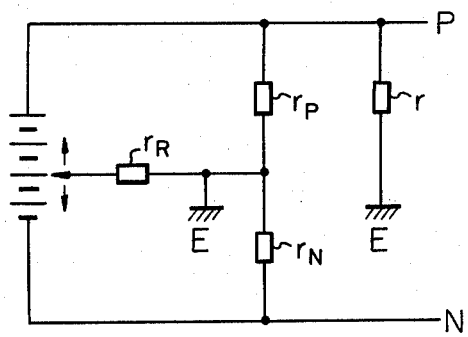
FIGS. 3A and 3B are equivalent circuit diagrams of the diagram of FIG. 2 when the switch is in the position (1)
Figure 3B:
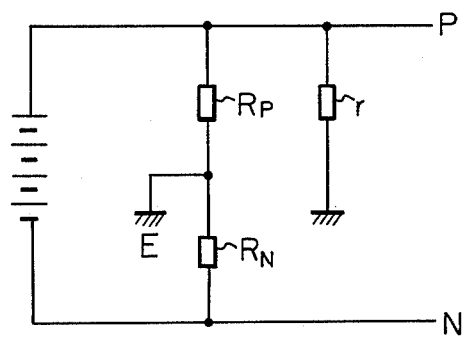
Figure 4A:
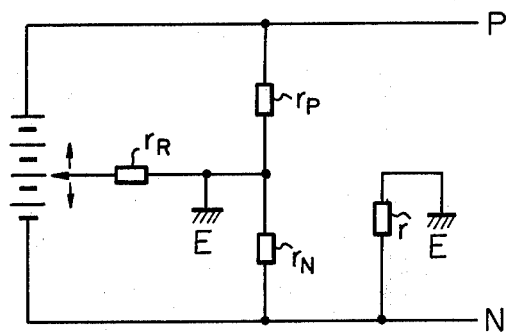
FIGS. 4A and 4B are equivalent circuit diagrams of the diagram of FIG. 2 when the switch is in the position (2)
Figure 4B:
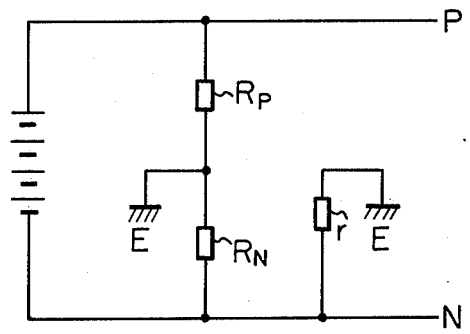

The equivalent measuring circuit of combination No. 1 is shown in FIG. 2. The equivalent of this circuit with the switch at the position (1) is shown in FIG. 3A. The combined resistances of this equivalent circuit is shown in FIG. 3B. The equivalent of the circuit illustrated in FIG. 2 with the switch at the position (2) is shown in FIG. 4A. The combined resistances of this equivalent circuit is shown in FIG. 4B. In combination of these resistances, for the sake of simplification, it is provided that $r_1 = r_2 = r$, $r_P = r_{PO} \parallel \rho$, $r_N = r_{NO} \parallel \rho$, $R_P = 2r_R \parallel r_{PO} \parallel \rho$, $R_N = 2r_R \parallel r_{NO} \parallel \rho$, in which $\rho$ is the internal resistance of the measuring means, and the mark $\parallel$ denotes the combination of the parallel resistances. Further in the following description, $V_{P1}$ and $V_{N1}$ denote the measured values of $V_P$ and $V_N$ respectively when the switch is at the position (1), and $V_{P2}$ and $V_{N2}$ denote the measured values of $V_P$ and $V_N$ respectively when the switch is at the position (2). The relational formulas between the resistances and between the voltages are shown collectively in Table 2.

Table 2

Relational formulas between resistances $$\frac{1}{r_P} = \frac{1}{r_{PO}} + \frac{1}{\rho} \quad (2)$$

$$\frac{1}{r_N} = \frac{1}{r_{NO}} + \frac{1}{\rho} \quad (3)$$

Table 2-continued $$\frac{1}{R_P} = \frac{1}{r_{P0}} + \frac{1}{2r_R} + \frac{1}{\rho} \qquad (4)$$

$$\frac{1}{R_N} = \frac{1}{r_{N0}} + \frac{1}{2r_R} + \frac{1}{\rho} \qquad (5)$$

Relational formulas between voltages $$V_{P1} + V_{N1} = V_{O1} \qquad (6)$$

$$\frac{V_{P1}}{V_{P1} + V_{N1}} = K_{P1}, \quad \frac{V_{N1}}{V_{P1} + V_{N1}} = K_{N1} \qquad (7)$$

$$V_{P2} + V_{N2} = V_{O2} \qquad (8)$$

$$\frac{V_{P2}}{V_{P2} + V_{N2}} = K_{P2}, \quad \frac{V_{N2}}{V_{P2} + V_{N2}} = K_{N2} \qquad (9)$$

$$K_{P1} + K_{N1} = 1 \qquad (10)$$

$$K_{P2} + K_{N2} = 1 \qquad (11)$$

In the formulas of Table 2, $K_{PX}$ is the voltage ratio between P-E when the switch is in the position (X), and $K_{NX}$ is the voltage ratio between N-E when the switch is in the position (X). By the use of these relational formulas, the relationship between the unknown values of the circuit of FIG. 3B is expressed by the following formula:

$$\frac{K_{N1}}{R_N} = K_{P1}\left(\frac{1}{R_P} + \frac{1}{r}\right) \qquad (12)$$

Similarly, the relationship between the unknown values of the circuit of FIG. 4B is expressed by the following formula:

$$K_{N2}\left(\frac{1}{R_N} + \frac{1}{r}\right) = K_{P2} \cdot \frac{1}{R_P} \qquad (13)$$

If the formulas (12) and (13) are solved with respect to $1/R_P$ and $1/R_N$, respectively, the following formulas are obtained:

$$\frac{1}{R_P} = \frac{1}{r} \cdot \frac{K_{N2}}{1 - (K_{P1} + K_{N2})} \qquad (14)$$

$$\frac{1}{R_N} = \frac{1}{r} \cdot \frac{K_{P1}}{1 - (K_{P1} + K_{N2})} \qquad (15)$$

Assuming here that $R_{PO}$ and $R_{NO}$ are defined similarly to the definitions of $r_{po}$ and $r_{no}$, i.e., $1/R_p = 1/R_{pO} + 1/\rho$ and $1/R_N = 1/R_{NO} + 1/\rho$, then the following formulas are obtained:

$$\left.\begin{array}{l}\dfrac{1}{R_{PO}} = \dfrac{1}{r} \cdot \dfrac{K_{N2}}{1 - (K_{P1} + K_{N2})} - \dfrac{1}{\rho} \\[6pt] \dfrac{1}{R_{NO}} = \dfrac{1}{r} \cdot \dfrac{K_{P1}}{1 - (K_{P1} + K_{N2})} - \dfrac{1}{\rho} \\[6pt] \dfrac{1}{R_O} = \dfrac{1}{R_{PO}} + \dfrac{1}{R_{NO}}\end{array}\right\} \qquad (16)$$

Where $R_O$ is the total resistance value. When $r_R$, $r_{PO}$ and $r_{NO}$ are solved, since $\rho$ is a fixed resistance value, it is detected as the resistance in the wiring and is included in $r_P$ and $r_N$. Accordingly assuming here that $$\left.\begin{array}{l}K_R(P_1) = \dfrac{\Delta V(P_1)}{V_{P1} + V_{N1}} \\[6pt] K_R(N_2) = \dfrac{\Delta V(N_2)}{V_{P2} + V_{N2}}\end{array}\right\}, \qquad (17)$$

then, $K_R(P_1) = K_R(N_2)$. This can be divided between $P_1$ and $N_2$, and the following formulas are obtained:

$$\frac{1}{r_R} = \frac{\pi}{2} \cdot \frac{K_R(P_1) + K_R(N_2)}{1 - (K_{P1} + K_{N2})} \cdot \frac{1}{r} \qquad (18)$$

$$\frac{1}{r_P} = \frac{K_{N2} - \frac{\pi}{2} \cdot K_R(N_2)}{1 - (K_{P1} + K_{N2})} \cdot \frac{1}{r} \qquad (19)$$

$$\frac{1}{r_N} = \frac{K_{P1} - \frac{\pi}{2} \cdot K_R(P_1)}{1 - (K_{P1} + K_{N2})} \cdot \frac{1}{r} \qquad (20)$$

Accordingly, $$\frac{1}{r_{P0}} = \frac{K_{N2} - \frac{\pi}{2} \cdot K_R(N_2)}{1 - (K_{P1} + K_{N2})} \cdot \frac{1}{r} - \frac{1}{\rho} \qquad (21)$$

$$\frac{1}{r_{N0}} = \frac{K_{P1} - \frac{\pi}{2} \cdot K_R(P_1)}{1 - (K_{P1} + K_{N2})} \cdot \frac{1}{r} - \frac{1}{\rho} \qquad (22)$$

By using $V_P$, $V_N$ and the switch positions (1) and (2) in the above formulas, $R_{PO}$, $R_{NO}$ and $R_O$ (Formula (16)), $r_R$ (Formula (18)), $r_{PO}$ (Formula (21)), and $r_{NO}$ (Formula (22)) can be calculated.

Solutions in other combinations of the measured voltage and the switch position can be described similarly. However, the above described combination is more advantageous than in the others in that both the combination of the measured voltages and the combination of the switch positions are highly symmetrical to thereby make the relational formulas also highly symmetrical and their solutions simple, and that, in the design of the apparatus for practising the method, there is no need to measure $V_O$, thereby producing components directly connecting between P and N without passing through E and the construction and the manufacture of the insulator very simple.

Instability index k will now be defined as an index to judge whether the measured insulation value is stable or variable irrespective of its magnitude.

In the case of the above-described combination, the measurement and the calculation are performed in the order listed in Table 3.

Table 3

| Order of Measurement | $K_{P1}$ | $K_{N2}$ | Calculation |
|---|---|---|---|
| 1 | $K_{P1}(1)$ | | |
| 2 | | $K_{N2}(2)$ | $K_2 = K_{P1}(1) + K_{N2}(2)$ |
| 3 | $K_{P1}(3)$ | | $K_3 = K_{P1}(3) + K_{N2}(2)$ |
| 4 | | $K_{N2}(4)$ | $K_4 = K_{P1}(3) + K_{N2}(4)$ |
| 5 | $K_{P1}(5)$ | | $K_5 = K_{P1}(5) + K_{N2}(4)$ |
| 6 | | $K_{N2}(6)$ | $K_6 = K_{P1}(5) + K_{N2}(6)$ |
| . | | | |
| . | | | |
| . | | | |

Here, $$A(3) = \frac{K_{P1}(1) + K_{N2}(2)}{K_{P1}(3) + K_{N2}(2)} = \frac{K_2}{K_3} \qquad (23)$$

Table 3-continued

| Order of Measurement | $K_{P1}$ | $K_{N2}$ | Calculation |
|---|---|---|---|
| | | | $A(4) = \dfrac{K_3}{K_4}$ |
| | | | $A(5) = \dfrac{K_4}{K_5}$ |

Then, the instability index $k_i$ is defined as follows:

$$k_i = \log A(i) = \log K_{i-1} - \log K_i \tag{24}$$

where $i = 3, 4, \ldots$

Now, any change in the insulation value will effect the voltage ratios $K_{P1}$ and $K_{N2}$. Namely, when the following formula holds:

$$K = K_{P1} + K_{N2} = \frac{1}{1 + \dfrac{R}{r}} \tag{25}$$

the relationship expressed by the following formula exists in the formula (25):

$$\frac{1}{R} = \frac{1}{r_P} + \frac{1}{r_N} + \frac{1}{r_R} \tag{26}$$

Therefore, a change in any of $r_P$, $r_N$ and $r_R$ makes R change, which also makes K change. Here, if the variation rate of K which is continuously calculated deviates from unity, it may be supposed that any of the insulation values has changed. In practice, by making the logarithm of A(i) the instability index, irrespective of whether the changed value is the numerator or the denominator of the fraction the evaluation of the change is identical. Namely, when $k_i$ is zero the stability is the largest, and the larger the absolute value of $k_i$ is, the larger the variation or the instability becomes. In other words, when the instability index is other than zero, the calculated values of $r_P$, $r_N$ and $r_R$ include errors.

In the case where the instability index is not zero but is slightly varying in the vicinity of zero, it becomes necessary to determine each of the insulation values within a certain range of error. For this purpose, an error determining index $\pm \epsilon \%$ is provided so that when any of the insulation values exceeds this index an alarm indicates an extraordinary change in the insulation value.

In practice, since a variation in a high insulation resistance value is not detrimental in itself, the errors are defined by the following formulas:

$$\epsilon_P = \frac{\log r_P \text{ (preceding value)} - \log r_P \text{ (current value)}}{\log r_P \text{ (preceding value)}} \tag{27}$$

$$\epsilon_N = \frac{\log r_N \text{ (preceding value)} - \log r_N \text{ (this time value)}}{\log r_N \text{ (preceding value)}} \tag{28}$$

$$\epsilon_R = \frac{\log r_R \text{ (preceding value)} - \log r_R \text{ (this time value)}}{\log r_R \text{ (preceding value)}} \tag{29}$$

The above definitions are convenient in practice since the higher the insulation resistance value is, the larger variation is required for the calculated value thereof to reach the prescribed value $\pm \epsilon \%$ with respect to the same prescribed value.

Figure 5A:
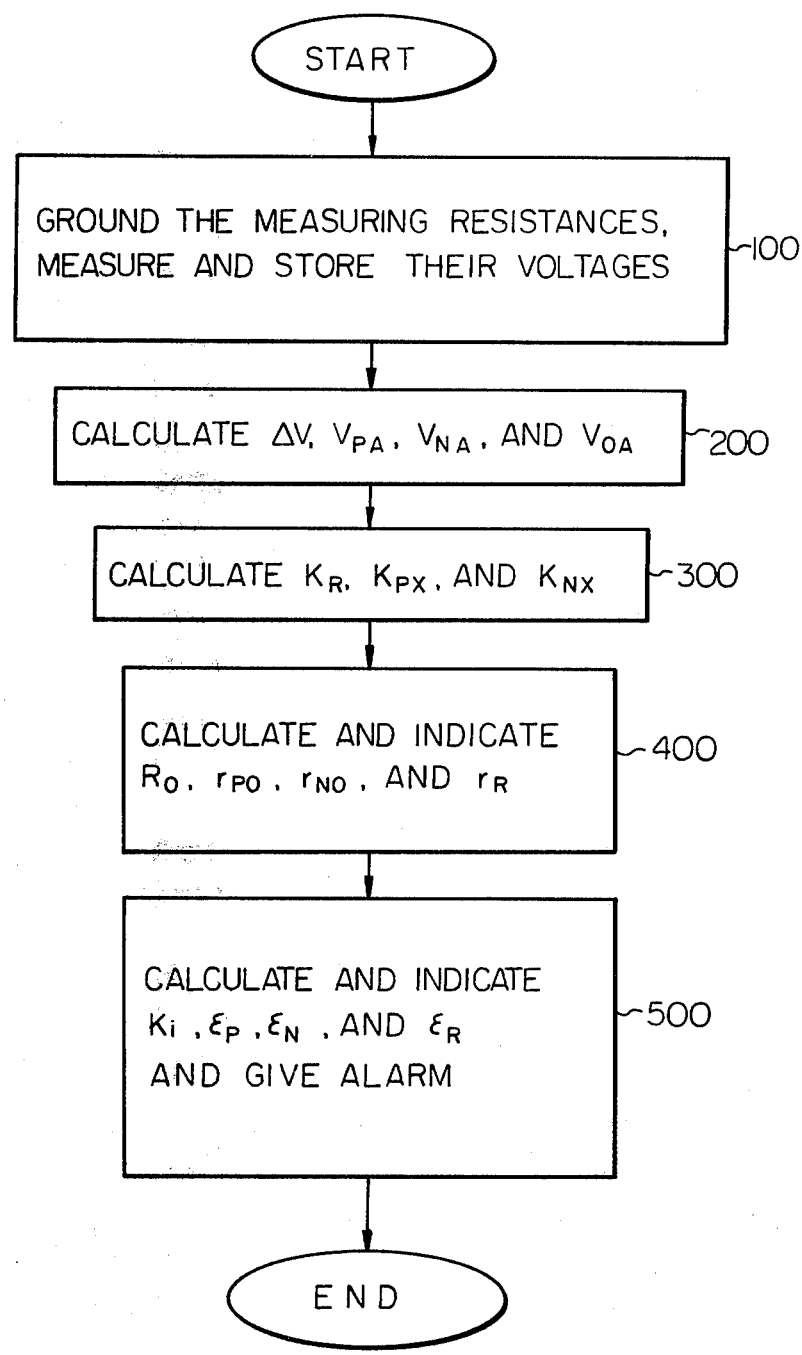
FIGS. 5A and 5B are flow charts illustrative of a preferred example of the method according to the present invention.

A preferred example of the method according to the present invention will now be described hereinbelow with reference to the drawings. FIG. 5A is a flow chart illustrative of an outline of the method for measuring the insulation resistance according to the present invention. As shown in FIG. 5A, measuring resistances connected to the circuit to be measured are first selectively grounded and, at the same time, the instantaneous voltage values $V_P$ and $V_N$ are measured and successively stored (Box 100). This operation is repeated cyclically as will be described hereinafter. Then, the average variation value $\Delta V$ and the average values $V_{PA}$, $V_{NA}$ of the instantaneous voltage values to ground of the positive and the negative lines respectively, and the average voltage $V_{OA}$ across the positive and negative lines are calculated from these stored values $V_P$ and $V_N$ (Box 200). Then, the voltage ratios $K_R$, $K_{PX}$, and $K_{NX}$ of the average voltage across the positive and negative lines to the average variation value and to the average values respectively of the instantaneous voltage values to ground are calculated from the calculated values (Box 300). Further, from the voltage dividing ratios, a total insulation resistance value $R_O$ between said positive and negative lines, an insulation resistance value $r_R$ of the load means connected between said positive and negative lines, and insulation resistance values to ground $r_{PO}$ and $r_{NO}$ of the positive and negative lines respectively are calculated and indicated (Box 400). Still further a value $K_i$ for evaluating each of the calculated insulation resistance values, and variation rates $\epsilon_P$, $\epsilon_N$, and $\epsilon_R$ of the insulation resistance values are calculated, indicated, and an alarm is issued when necessary (Box 500). The above-described flow of operation stands for only one cycle of measurement of the insulation resistance values and, accordingly, it must be noted here that this flow of operation is continuously performed.

Figure 5B:
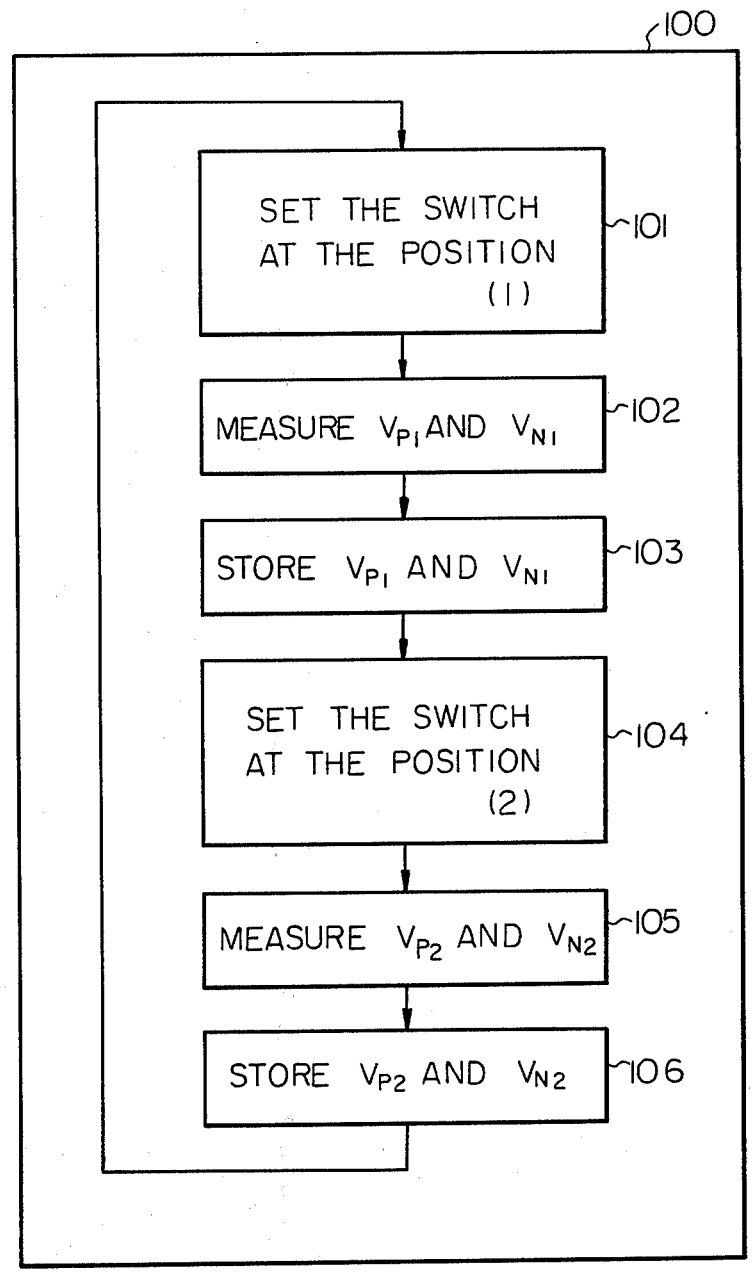

FIG. 5B is a partial flow chart illustrating that the operations of the Box 100 of FIG. 5A are also cyclic. Namely, first the switch for selecting the grounding of the measuring resistances is set to the position (1) of FIG. 2 (Box 101), $V_{P1}$ and $V_{N1}$ are measured (Box 102) and stored (Box 103), then the switch is set to the position (2) of FIG. 2 (Box 104), $V_{P2}$ and $V_{N2}$ are measured (Box 105) and stored (Box 106), and the entire operation is cyclically repeated. The values used in the calculations of Boxes 200 to 500 of FIG. 5A are successively taken out of the memory means, utilized and erased when they become unnecessary.

FIG. 6 shows an embodiment of the apparatus for practising the measuring principle according to the present invention described hereinabove. In FIG. 6, reference numerals 1 and 2 denote means for detecting or measuring $V_P$ and $V_N$ respectively. Reference characters $r_1$ and $r_2$ denote measuring resistances selectively grounded by switching means, for example, relays a and b respectively. Transistors $T_{r1}$ and $T_{r2}$, and resistances $R_1$ to $R_4$ together form buffer amplification circuits.

Outputs of the detecting or measuring means 1 and 2 are stored in temporary storing registers 3, 4 and 5. Calculating means 6, 7 and 8 are provided for calculating the average variation value $\Delta V$ of the measured voltages, the average value of $V_P$ and the average value of $V_N$ respectively. Calculating means 9 is provided for calculating the average voltage $V_{OA}$ across the positive and negative lines from the outputs of calculating means 7 and 8. Calculating means 10, 11 and 12 are provided for calculating the voltage ratios $K_R$, $K_{P1}$ and $K_{N2}$ respectively using the calculation results of calculating means 6, 7 and 8 and for applying these calculated ratios to calculating means 13 which is provided for calculating $R_O$, $r_R$, $r_{PO}$, $r_{NO}$, $R_{PO}$, $R_{NO}$, $k_i$, etc. from said ratios and for applying the results to suitable indicating, recording or alarming means 14. Any of the various commercially available lowtension AC-DC voltage testers and the like may be used as the detecting or measuring means.

While some components of these embodiments such as, for example, the register for temporary storage and the calculating means are shown and described hereinabove as being provided in a plurality of units respectively, it will be obvious that these embodiments are merely for the purpose of illustration and description and that these components can be assembled into a single electronic computer unit.

As will be obvious from the foregoing description, according to the present invention, unlike the prior art using megaohmmeters, it is made possible to continuously measure the insulation resistance values of a non-grounded DC circuit including a rectified electric power source under operative conditions, it is further made possible to reduce the required inspecting steps and secure efficient use of the measuring apparatus by measuring and recording the resistance values while successively switching to a number of nongrounded DC circuits using a depressor bar type recorder or the like, to thereby effectively prevent accidents in a factory owing to deterioration of insulation.

While we have shown and described specific embodiments and examples of our invention, it will be understood that these embodiments and examplesare merely for the purpose of illustration and description and that various other forms may be devised within the scope of our invention, as defined in the appended claims.

We claim:

1. A method for providing the values needed for calculation of the insulation resistance in a non-grounded DC circuit having load means connected to the circuit comprising the steps of:
   (a) selectively and successively grounding the positive line and the negative line through a measurement resistance for forceably changing the proportions among the voltage on the positive line, the voltage on the negative line and the voltage on the ground line;
   (b) measuring two instantaneous voltage values from among the voltage on the positive line, the voltage on the negative line and the voltage on the ground line for both said successive groundings; and
   (c) temporarily and successively storing said measured instantaneous voltage values.

2. A method for providing the values needed for calculation of insulation resistance according to claim 1, in which the steps of selectively and successively grounding the positive line and the negative line and of measuring said instantaneous voltage values comprise the steps of:
   (a) grounding the positive line through said measurement resistance;
   (b) measuring said instantaneous voltage values between the positive line and ground and between the negative line and ground;
   (c) ungrounding the positive line;
   (d) grounding the negative line through said measurement resistance;
   (e) measuring said instantaneous voltage values between the positive line and ground and between the negative line and ground; and
   (f) ungrounding the negative line.

3. An apparatus for providing the values of the insulation resistance in a non-grounded DC circuit having load means connected to the circuit comprising;
   (a) a first measurement resistance connected to the positive line of said non-grounded DC circuit;
   (b) a second measurement resistance connected to the negative line of said non-grounded DC circuit;
   (c) a switching means connected to said first and second measurement resistances for selectively grounding said first and second measurement resistances;
   (d) a measuring means connected to at least two of the positive line, the negative line and the ground line for measuring two instantaneous voltage values from among the voltage on the positive line, the voltage on the negative line and the voltage on the ground line;
   (e) a memory means connected to said measuring means for temporarily and successively storing said measured instantaneous voltage values; and
   (f) a calculating means connected to said memory means for calculating the insulation resistance from said measured instantaneous voltage values stored in said memory means.

4. An apparatus for providing the values of insulation resistance according to claim 3, wherein: said measuring means comprises a means for measuring the instantaneous voltage value between the positive line and ground and the instantaneous voltage value between the negative line and ground.

5. An apparatus for providing the values of insulation resistance according to claim 3, further comprising: an indicating means connected to said calculating means for indicating the results of the calculation of insulation resistance.

6. An apparatus for providing the values (a) of insulation resistance in a non-grounded DC circuit having load means connected to the circuit, and (b) of successive instability indices of the variation of calculated insulation resistance, said apparatus comprising:
   (a) a first measurement resistance connected to the positive line of said non-grounded DC circuit;
   (b) a second measurement resistance connected to the negative line of said non-grounded DC circuit;
   (c) a switching means connected to said first and second measurement resistances for selectively grounding said first and second measurement resistances;
   (d) a measuring means connected to at least two of the positive lines, the negative line and the ground line for measuring two instantaneous voltage values from among the voltage on the positive line, the voltage on the negative line and the voltage on the ground line;
   (e) a memory means connected to said measuring means for temporarily successively storing said measured instantaneous voltage values;
   (f) a first calculating means connected to said memory means for calculating the insulation resistance from said measured instantaneous voltage values stored in said memory means;
   (g) an indicating means connected to said first calculating means for indicating the results of the calculation of insulation resistance;
   (h) a second calculating means connected to said first calculating means for calculating successive instability indices of the variation of the calculated insulation resistance from said insulation resistance calculated by said first calculating means; and
   (i) an alarm means connected to said second calculating means for producing an alarm when one of the instability indices exceeds a predetermined value.

* * * * *